United States Patent
Consoer et al.

(10) Patent No.: US 10,425,075 B1
(45) Date of Patent: Sep. 24, 2019

(54) SWITCHING REGULATOR SLEW RATE CONTROL WITH S-CURVE SHAPING

(71) Applicant: Dialog Semiconductor (UK) Limited, London (GB)

(72) Inventors: Kelly Consoer, Tempe, AZ (US); Bryan Quinones, Chandler, AZ (US); Kevin Yi Cheng Chang, Tempe, AZ (US); Mark Mercer, Phoenix, AZ (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/966,265

(22) Filed: Apr. 30, 2018

(51) Int. Cl.
| | | |
|---|---|---|
| *H02M 1/08* | (2006.01) | |
| *H03K 17/16* | (2006.01) | |
| *H02M 1/44* | (2007.01) | |
| *H02M 3/158* | (2006.01) | |
| *H02M 1/088* | (2006.01) | |

(52) U.S. Cl.
CPC ............ *H03K 17/165* (2013.01); *H02M 1/08* (2013.01); *H02M 1/088* (2013.01); *H02M 1/44* (2013.01); *H02M 3/158* (2013.01); *H02M 3/1588* (2013.01)

(58) Field of Classification Search
CPC . H02M 1/08; H02M 2001/0029; H02M 3/156
See application file for complete search history.

(56) References Cited

U.S. PATENT DOCUMENTS

| | | | | |
|---|---|---|---|---|
| 7,327,130 B1* | 2/2008 | Giannopoulos | ..... | H02M 3/1588 323/275 |
| 9,929,652 B1* | 3/2018 | Ribarich | ................. | H02M 1/08 |
| 2002/0176198 A1* | 11/2002 | Cyrusian | .......... | G11B 20/10009 360/68 |
| 2010/0079127 A1* | 4/2010 | Grant | .................... | H02M 3/156 323/285 |

(Continued)

OTHER PUBLICATIONS

"Switching-Behavior Improvement of Insulated Gate-Controlled Devices," by Salvatore Musumeci et al., IEEE Transactions on Power Electronics, vol. 12, No. 4, Jul. 1997, pp. 645-653.
"Research of Active Gate Drivers for MOSFET by Thermography," by Anna Andonova et al., ACMOS'10 Proceedings of the 12th WSEAS International Conference on Automatic Control, Modelling & Simulation, May 29-31, 2010, pp. 253-256.

(Continued)

*Primary Examiner* — Yusef A Ahmed
*Assistant Examiner* — Ishrat F Jamali
(74) *Attorney, Agent, or Firm* — Saile Ackerman LLC; Stephen B. Ackerman

(57) ABSTRACT

Driver circuits with S-shaped gate drive voltage curves for ramp-up and ramp-down of power field effect transistors are presented. In ramp-up, the S-shaped curve rapidly ramps the gate voltage of the power FET to its threshold. This ramp-up is self-terminating. The gate voltage of the power FET is slewed through saturation with a time constant. After a predetermined time, the gate of the power FET is driven to approach the supply voltage level. In ramp-down, the S-shaped curve rapidly ramps the gate voltage of the power FET down to its threshold voltage. This ramp-down is self-terminating. The gate voltage of the power FET is slewed through saturation. The gate-source voltage of the power FET is rapidly ramped down to zero. Such S-shaped (Continued)

curves for the gate drive signal allow the control of the transition times of the gate drive signal to acceptable levels of voltage/current spikes and electromagnetic interference.

28 Claims, 11 Drawing Sheets

(56) References Cited

U.S. PATENT DOCUMENTS

| | | | |
|---|---|---|---|
| 2013/0223651 A1* | 8/2013 | Hoyerby | H03F 3/2173 381/120 |
| 2013/0342242 A1* | 12/2013 | Hsieh | H02M 1/088 327/108 |

OTHER PUBLICATIONS

"Active Gate Voltage Control of Turn-on di/dt and Turn-off dv/dt in Insulated Gate Transistors," by Nadir Idir et al., IEEE Transactions on Power Electronics, vol. 21, No. 4, Jul. 2006, pp. 849-855.

"Shaping High-Power IGBT Switching Transitions by Active Voltage Control for Reduced EMI Generation," by Xin Yang et al., IEEE Transactions on Industry Applications, vol. 51, No. 2, Mar./Apr. 2015, pp. 1669-1677.

"Efficient Voltage/Current Spike Reduction by Active Gate Signaling," by Arash A. Boora et al., 2009 Electromagnetic Compatibility Symposium Adelaide, Aug. 16, 2009, pp. 59-64.

"Design of CMOS inverter-based output buffers adapting the Cherry-Hooper broadbanding technique," by Tomoaki Maekawa et al., 2009 European Conference on Circuit Theory and Design, Aug. 23-27, 2009, 4 pages.

* cited by examiner

SWITCHING REGULATOR SLEW RATE CONTROL WITH S-CURVE SHAPING

TECHNICAL FIELD

This disclosure relates to driver circuits for driving power field effect transistors (FETs) and methods of driving power FETs. This disclosure particularly relates to driver circuits and methods for driving power FETs for ramp-up slew-on control and/or ramp-down slew-off control of the power FETs. This disclosure is particularly applicable to power FETs in DC-DC converters.

BACKGROUND

Power efficiency of switching converters (as examples of DC-DC converters) can be improved by shortening the transition time of the gate drive signals onto the pass transistors. On the other hand, fast transition edges of the gate drive signals potentially cause voltage/current spikes and in turn show high switching noise and electromagnetic interference (EMI).

SUMMARY

There is a need for driver circuits for power FETs of DC-DC converters and methods of driving power FETs of DC-DC converters that allow to control the transition times for gate drive signals to acceptable levels of voltage/current spikes and EMI.

In view of some or all of these needs, the present disclosure proposes driver circuits for driving a power FET in a DC-DC converter and corresponding methods of driving a power FET in a DC-DC converter, having the features of the respective independent claims.

An aspect of the disclosure relates to a driver circuit for driving a power FET in a DC-DC converter. The driver circuit may be a driver circuit (ramp-up driver) for ramp-up of a gate voltage of the power FET (e.g., for ramp-up slew-on control). The driver circuit may include a bias current generation circuit for generating a bias current in response to an enable signal for switching on the power FET. The bias current generation circuit may be a switched current source, for example. The driver circuit may further include an output transistor for outputting, at its source, a gate drive signal for the power FET. The driver circuit may yet further include a replica FET of the power FET. The replica FET and the bias current generation circuit may be coupled in series between a supply voltage level and a source of the power FET. A drain of the output transistor may be coupled to the supply voltage level. A gate of the output transistor may be coupled to an intermediate node between the bias current generation circuit and the replica FET. A gate of the replica FET may be coupled to a drain of the replica FET through a capacitor and may be coupled to the source of the power FET through a resistance. The capacitor may be said to be a Miller tied capacitor across the replica FET. The capacitor may be initialized, cycle-by-cycle, as a diode connection across the replica FET. The resistance may be a resistor for example.

Configured as described above, the proposed driver circuit allows the implementation of an S-shaped curve (or Z-shaped curve) for the gate drive signal for ramp-up (turn-on) of the power FET. The S-shaped curve rapidly ramps the gate voltage of the power FET to its threshold. This ramp-up, which is provided for in part by the replica FET, is self-terminating. Subsequently, the gate voltage of the power FET is stewed through saturation in accordance with a time constant that is given by the dimensions of the capacitor and the resistance. After a predetermined time (that depends on the time constant), the gate of the power FET is driven to approach the supply voltage level. Such an S-shaped curve for the gate drive signal allows to control the transition times for the gate drive signal to acceptable levels of voltage/current spikes and EMI.

In some embodiments, the driver circuit may further include a comparator for comparing the gate drive signal (or the gate-source voltage) for the power FET to a reference value. The reference value may be the threshold voltage of the power FET or may be a predetermined amount (e.g., 0.5V) above the threshold voltage of the power FET. The driver circuit may yet further include a switch for coupling a gate of the power FET to the supply voltage level in dependence on a result of the comparison. This allows to quickly raise the gate drive signal to its maximum value (e.g., the supply voltage level) by means of a hard switch once the gate-source voltage of the power FET has risen above the threshold voltage.

In some embodiments, the resistance may be a first resistance. The driver circuit may further include a series connection of a second resistance and a transistor switch. The series connection may be coupled, in parallel to the first resistance, between the gate of the replica FET and the source of the replica FET. Thereby, the slew rate of the gate drive signal can be adapted (e.g., increased) once the power FET is in the triode region.

In some embodiments, the driver circuit may further include a transistor coupled between the intermediate node and the replica FET. A gate of the transistor may be coupled to a drain of the transistor. Thus, the transistor may be a diode-connected FET, for example. The transistor may be a replica of the output transistor. This transistor serves to shift up the voltage level of the gate drive signal by its gate-source voltage (e.g., its threshold voltage) if biased. Thereby, a corresponding drop of the voltage level of the gate drive signal at the output transistor can be compensated for.

In some embodiments, the bias current generation circuit may include a switch that is switched in response to the enable signal. The switch may be a transistor switch, for example. The bias current generation circuit may further include a gate-source voltage multiplier circuit. The gate-source voltage multiplier circuit may include a first transistor and a resistor divider (e.g., voltage divider). The resistor divider may be coupled between a drain and a source of the first transistor. Further, an intermediate tap node of the resistor divider may be coupled to a gate of the first transistor. The bias current generation circuit may further include a capacitor coupled between the gate of the first transistor and the source of the first transistor. The bias current generation circuit may further include a first resistance for applying a bias to the gate-source voltage multiplier circuit. The bias current generation circuit may yet further include a second resistance and a second transistor that are coupled in series between the supply voltage level and the intermediate node. The first and second transistors may be PMOS transistors, for example. The gate-source voltage multiplier circuit, the first resistance, and the switch may be coupled in series between the supply voltage level and ground. A gate of the second transistor may be coupled to a second intermediate node between the gate-source voltage multiplier circuit and the first resistance. The gate-source voltage multiplier circuit may bias the second resistance with the bias current. Therein, the bias current may depend on a multiplied (e.g., scaled) gate-source voltage of the first transistor.

The driver circuit may further include a first reset switch for coupling the intermediate node to ground in dependence on the enable signal, e.g., cycle-by-cycle. For example, the first reset switch may be activated by an inverted version (enable_not) of the enable signal. Additionally or alternatively, the driver circuit may further include a second reset switch for coupling the drain of the replica FET to the source of the power FET in dependence on the enable signal, e.g., cycle-by-cycle. For example, the second reset switch may be activated by an inverted version (enable_not) of the enable signal. The reset switches may be transistor switches, for example. Here, in dependence on the enable signal may include to mean in response to the absence of the enable signal, for example, or in response to an inverted version of the enable signal, as indicated above. By means of these reset switches, the driver circuit can be reset on a cycle-by-cycle basis, to ensure uniform starting conditions and uniform switching behavior between cycles.

Another aspect of the disclosure relates to a further driver circuit for driving a power FET in a DC-DC converter. The driver circuit may be a driver circuit (ramp-down driver) for ramp-down of a gate voltage of the power FET (e.g., for ramp-down slew-off control). The driver circuit may include a transistor switch that is switched in response to an enable signal for switching off the power FET. The driver circuit may further include a replica FET of the power FET. The replica FET and the transistor switch may be coupled in series between a drain of the power FET and a gate of the power FET. A gate of the replica FET may be coupled to a source of the replica FET through the transistor switch.

Configured as described above, the proposed driver circuit allows the implementation of an S-shaped curve (or Z-shaped curve) for the gate drive signal for ramp-down (turn-off). The S-shaped curve rapidly ramps the gate voltage of the power FET down to its threshold voltage. This ramp-down, which is provided for in part by the replica FET, is self-terminating. Such an S-shaped curve for the gate drive signal allows to control the transition times for the gate drive signal to acceptable levels of voltage/current spikes and EMI.

In some embodiments, the driver circuit may further include a bias current generation circuit for generating a bias current in response to the enable signal. The bias current generation circuit may be a switched current source, for example. The bias current generation circuit may be coupled between the gate of the power FET and a source of the power FET. Providing the bias current generation circuit allows the slewing of the gate voltage of the power FET through the saturation range of the power FET, potentially up to the maximum value of the gate voltage.

In some embodiments, the driver circuit may further include a comparator for comparing the gate drive signal (or the gate-source voltage) for the power FET to a reference value. The reference value may be the threshold voltage of the power FET or may be a predetermined amount (e.g., 0.5V) below the threshold voltage of the power FET. The driver circuit may yet further include a switch for coupling the gate of the power FET to the source of the power FET in dependence on a result of the comparison. This allows to quickly lower the gate drive signal to its minimum value (e.g., down to a point where the gate-source voltage is zero) by means of a hard switch once the gate-source voltage of the power FET has fallen below the threshold voltage.

In some embodiments, the bias current generation circuit may include a switch that is switched in response to the enable signal. The bias current generation circuit may further include an RC circuit including a parallel connection of a first resistance and a capacitor. The bias current generation circuit may further include a gate-source voltage multiplier circuit. The gate-source voltage multiplier circuit may include a first transistor and a resistor divider (e.g., voltage divider). The resistor divider may be coupled between a drain and a source of the first transistor. Further, an intermediate tap node of the resistor divider may be coupled to a gate of the first transistor. The bias current generation circuit may further include a second transistor and a second resistance that are coupled in series between the gate of the power FET and the source of the power FET. The switch, the RC circuit, and the gate-source voltage multiplier circuit may be coupled in series between the supply voltage level and the source of the power FET. A gate of the second transistor may be coupled to an intermediate node between the RC circuit and the gate-source voltage multiplier circuit, so that a voltage that depends on a multiplied (e.g., scaled) gate-source voltage of the first transistor is provided to the gate of the second transistor. That is, the gate of the second transistor may be coupled to the drain of the first transistor.

This bias current generation circuit allows the slewing of the gate voltage of the power FET through saturation in accordance with a multiplication factor of the gate-source voltage multiplier circuit. The bias current generation circuit further allows to ramp the gate-source voltage of the power FET to zero.

In some embodiments, the driver circuit may further include a series connection of a third resistance and a transistor switch. The series connection may be coupled between a gate of the first transistor and the source of the power FET, so that a multiplication ratio of the gate-source voltage multiplier circuit is modified when the transistor switch is switched on (enabled). Thereby, the slew rate of the gate drive signal through saturation can be adapted (e.g., increased) once the power FET is in the saturation region. The transistor switch may be switched in accordance with a dedicated control signal for modifying the slew rate of the gate drive signal, for example.

In some embodiments, the driver circuit may further include a reset switch for coupling the intermediate node to the source of the power FET in dependence on the enable signal, e.g., cycle-by-cycle. For example, the reset switch may be activated by an inverted version (enable_not) of the enable signal. By means of this reset switch, the driver circuit can be reset on a cycle-by-cycle basis, to ensure uniform starting conditions and uniform switching behavior between cycles.

Another aspect of the disclosure relates to a further driver circuit for driving a power FET in a DC-DC converter. The driver circuit may be a driver circuit (ramp-down driver) for ramp-down of a gate voltage of the power FET (e.g., for ramp-down slew-off control). The driver circuit may include a transistor switch that is switched in response to an enable signal for switching off the power FET. The driver circuit may further include a replica FET of the power FET. The driver circuit may yet further include a voltage stretch element (e.g., impedance). The replica FET, the voltage stretch element, and the transistor switch may be coupled in series between a gate of the power FET and a source of the power FET. The voltage stretch element may be coupled between a source of the replica FET and a drain of the transistor switch. A gate of the replica FET may be coupled to a drain of the replica FET.

Another aspect of the disclosure relates to a DC-DC converter that may include any, some, or all of the driver circuits according to the above aspects and embodiments.

Another aspect of the disclosure relates to a method of driving a power FET in a DC-DC converter. The method may be a method (ramp-up method) for ramp-up of a gate voltage of the power FET (e.g., for ramp-up slew-on control). The method may include providing a replica FET of the power FET. A gate of the replica FET may be coupled to a drain of the replica FET through a capacitor and may be coupled to a source of the power FET through a resistance. The method may further include providing a bias current generation circuit. The replica FET and the bias current generation circuit may be coupled in series between a supply voltage level and the source of the power FET. The method may further include providing an output transistor. A drain of the output transistor may be coupled to the supply voltage level. A gate of the output transistor may be coupled to an intermediate node between the bias current generation circuit and the replica FET. The method may further include generating, by the bias current generation circuit, a bias current in response to an enable signal for switching on the power FET. The method may further include applying the bias current to the replica FET. The method may yet further include outputting, at a source of the output transistor, a gate drive signal for the power FET.

In some embodiments, the method may further include comparing the gate drive signal (or the gate-source voltage) for the power FET to a reference value. The method may yet further include coupling, by a switch, a gate of the power FET to the supply voltage level in dependence on a result of the comparison.

In some embodiments, the resistance may be a first resistance. The method may further include providing a series connection of a second resistance and a transistor switch that is coupled, in parallel to the first resistance, between the gate of the replica FET and the source of the replica FET. The method may yet further include operating the switch to increase a voltage slew rate at a gate of the power FET.

In some embodiments, the method may further include providing a transistor coupled between the intermediate node and the replica FET. A gate of the transistor may be coupled to a drain of the transistor.

In some embodiments, the bias current generation circuit may include a switch that is switched in response to the enable signal. The bias current generation circuit may further include a gate-source voltage multiplier circuit. The gate-source voltage multiplier circuit may include a first transistor and a resistor divider (e.g., voltage divider). the resistor divider may be coupled between a drain and a source of the first transistor. Further, an intermediate tap node of the resistor divider may be coupled to a gate of the first transistor. The bias current generation circuit may further include a capacitor coupled between the gate of the first transistor and the source of the first transistor. The bias current generation circuit may further include a first resistance for applying a bias to the gate-source voltage multiplier circuit. The bias current generation circuit may yet further include a second resistance and a second transistor that are coupled in series between the supply voltage level and the intermediate node. The gate-source voltage multiplier circuit, the first resistance, and the switch may be coupled in series between the supply voltage level and ground. The gate-source voltage multiplier circuit may bias the second resistance with the bias current. Therein, the bias current may depend on a multiplied (e.g., scaled) gate-source voltage of the first transistor.

In some embodiments, the method may further include coupling, by a first reset switch, the intermediate node to ground in dependence on the enable signal, e.g., cycle-by-cycle. Additionally or alternatively, the method may further include coupling, by a second reset switch, the drain of the replica FET to the source of the power FET in dependence on the enable signal, e.g., cycle-by-cycle. For example, the reset switches may be activated by an inverted version (enable_not) of the enable signal.

Another aspect of the disclosure relates to a further method of driving a power FET in a DC-DC converter. The method may be a method (ramp-down method) for ramp-down of a gate voltage of the power FET (e.g., for ramp-down slew-off control). The method may include providing a replica FET of the power FET. The method may further include providing a transistor switch. A gate of the replica FET may be coupled to a source of the replica FET through the transistor switch. The replica FET and the transistor switch may be coupled in series between a drain of the power FET and a gate of the power FET. The method may yet further include switching the transistor switch in response to an enable signal for switching off the power FET.

In some embodiments, the method may further include providing a bias current generation circuit for generating a bias current in response to the enable signal. The bias current generation circuit may be coupled between the gate of the power FET and a source of the power FET. The method may further include generating a bias current in response to the enable signal. The method may yet further include applying the bias current to the replica FET.

In some embodiments, the method may further include comparing the gate drive signal (or the gate-source voltage) for the power FET to a reference value. The method may yet further include coupling, by a switch, the gate of the power FET to the source of the power FET in dependence on a result of the comparison.

In some embodiments, the bias current generation circuit may include a switch that is switched in response to the enable signal. The bias current generation circuit may further include an RC circuit including a parallel connection of a first resistance and a capacitor. The bias current generation circuit may further include a gate-source voltage multiplier circuit. The gate-source voltage multiplier circuit may include a first transistor and a resistor divider (e.g., voltage divider). The resistor divider may be coupled between a drain and a source of the first transistor. Further, an intermediate tap node of the resistor divider may be coupled to a gate of the first transistor. The bias current generation circuit may yet further include a second transistor and a second resistance that are coupled in series between the gate of the power FET and the source of the power FET. The switch, the RC circuit, and the gate-source voltage multiplier circuit may be coupled in series between the supply voltage level and the source of the power FET. A gate of the second transistor may be coupled to an intermediate node between the RC circuit and the gate-source voltage multiplier circuit, so that a voltage that depends on a multiplied (e.g., scaled) gate-source voltage of the first transistor is provided to the gate of the second transistor.

In some embodiments, the method may further include providing a series connection of a third resistance and a transistor switch that is coupled between a gate of the first transistor and the source of the power FET. The method may yet further include operating the transistor switch to modify a multiplication ratio of the gate-source voltage multiplier circuit.

In some embodiments, the method may further include coupling, by a reset switch, the intermediate node to the source of the power FET in dependence on the enable signal, e.g., cycle-by-cycle.

Another aspect relates to a further method of driving a power FET in a DC-DC converter. The method may be a method (ramp-down method) for ramp-down of a gate voltage of the power FET (e.g., for ramp-down slew-off control). The method may include providing a replica FET of the power FET. A gate of the replica FET may be coupled to a drain of the replica FET. The method may further include providing a voltage stretch element (e.g., impedance). The method may further include providing a transistor switch. The replica FET, the voltage stretch element, and the transistor switch may be coupled in series between a gate of the power FET and a source of the power FET. The voltage stretch element may be coupled between a source of the replica FET and a drain of the transistor switch. The method may yet further include switching the transistor switch in response to an enable signal for switching off the power FET.

Another aspect of the disclosure relates to a method of operating a DC-DC converter that includes a power FET. The method may include the methods according to any, some, or all of the three foregoing aspects and their embodiments for driving the power FET when ramping-up a gate voltage of the power FET and/or when ramping-down the gate voltage of the power FET.

Notably, the method may be applied to any of the circuits described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates a high-level block diagram of an example of a voltage regulator according to embodiments of the disclosure, FIG. 2 schematically illustrates an example of a driver circuit block in the voltage regulator of FIG. 1 according to embodiments of the disclosure, FIG. 3 schematically illustrates an example of a driver circuit that acts as a ramp-up driver according to embodiments of the disclosure, FIG. 4 schematically illustrates an example of an implementation of the driver circuit of FIG. 3 according to embodiments of the disclosure, FIG. 5A and FIG. 5B schematically illustrate examples of driver circuits that act as ramp-down drivers according to embodiments of the disclosure, FIG. 6 schematically illustrates an example of an implementation of the driver circuit of FIG. 5A according to embodiments of the disclosure, FIG. 7 schematically illustrates an example of a gate-source voltage profile of a power FET according to embodiments of the disclosure.

DESCRIPTION

Figure 1:
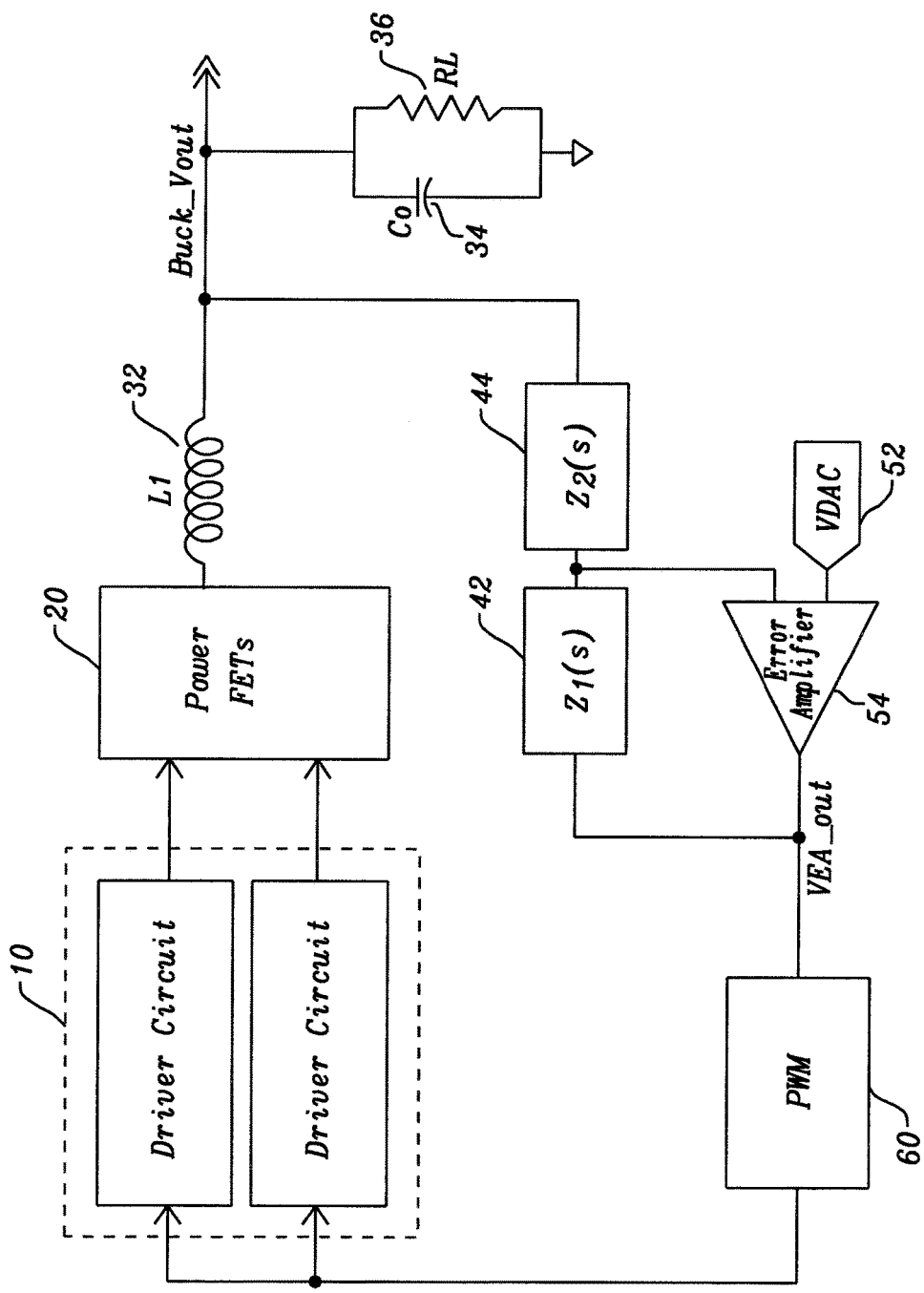

As indicated above, identical or like reference numbers in the disclosure indicate identical or like elements, and repeated description thereof may be omitted for reasons of conciseness.

As noted above, gate driver circuits with fast transition edges potentially cause voltage/current spikes and in turn show high switching noise and EMI problems. On the other hand, a sluggish gate driver circuit produces higher power loss and thus reduces power efficiency of the power converter.

Several approaches are feasible for controlling the transition slopes of gate drive signals of a power FET in a DC-DC converter.

For example, schemes with increased gate resistance to control the transition slopes of the gate drive signals could be pursued. However, these approaches do not show significant improvement compared to the original method without any compensation.

Alternatively, active gate signaling methods could be employed, where the gate drive signals are generated with a two-step gate control voltage or a three-step gate control voltage during the rising or falling transitions. Since in most low-power portable communication devices the total transition time is very limited (e.g., a few nanoseconds), the delay time and circuit response time become comparable to the total available time frame during the controlled transition intervals. Then, the timing control through the feedback loop of prior two-/three-step gate signaling may not be realistic implementations.

Further alternatively, complex control loops may be employed for a Gaussian gate drive signal generation. However, this may result in high implementation costs and may not be realistic in product development.

In summary, feasible schemes for controlling the transition slopes of gate drive signals of a power FET in a DC-DC converter may include current charging, resistive gate charging, or reduced driver sizing, which consumes excess clock period budget in the pre-charge and triode overdrive regions, limiting the application clock frequency. Further approaches may require active feedback on the drain-source voltage Vds of the power FET to control the gate driver. Such methods require high-speed amplifiers that do not saturate when the input is near either supply. These closed loop amplifiers must respond in nanoseconds, which puts considerable constraints on their implementation.

This disclosure proposes a new technique based on open loop driver sequencing, which can effectively prevent undesirable switching noise and EMI problems and also control the power loss during the switching operations. This new technique may be referred to as a power efficient method to create a slew-controlled power switch opening and closure, to reduce EMI and reduce driver overshoot ringing in switching regulators. Notably, the new technique can be generally applied to DC-DC converters and is particularly suited for regulators that operate with a high switching frequency.

Broadly speaking, the proposed technique achieves suppression of EMI emissions by means of an S-shaped power FET gate drive signal. The proposed technique further achieves power FET gate control that is immune to process, voltage, and temperature variations.

The proposed technique implements S-shaped gate driver characteristics, as will be described in more detail below. The desired S-shaped gate driver characteristic can be constructed from piece-wise sequences of fast open loop driver features terminated into diode connected FET loads matched to the power FETs. This open-loop method permits trimmable, precise, and temperature compensated switch rates in the nanosecond range, without feedback amplifiers. The proposed driver circuits are capable of accelerating the power FET gate-source voltage Vgs through the subthreshold pre-charge region and falling triode region of the gate drive, e.g., in less than 2 nsec per transition. The driver circuit also forces the power FET gate to dwell in the saturation region by engaging RC circuits on both the closing and opening transitions.

In some implementations of the proposed technique, a gate driver (driver circuit) for power-FET gate-to-source voltage ramping-profile control comprises (e.g., consists of) switching devices to achieve three-level voltage-steps at the power FET gates that slew in different MOS operational regions and give optimal slopes for both rising and falling edges. The gate driver may use a RC time-based controller and sense amplifier detecting scheme for a robust self-adjusting function, to thereby reduce any EMI issues.

Broadly speaking, in some implementations a driver circuit according to the proposed technique uses a device of the same type as an output device (e.g., pass device, power FET) of the power converter to turn on the output device, in order to create a reference level that is just lower than the threshold of the output device. The driver circuit then applies that voltage to the gate of the output device in order to minimize turn-on delay. The driver circuit then ramps up that reference voltage in a controlled manner in order to generate the desired slew rate of the output device. To turn off the output device, the driver circuit then creates a gate-drain short that will self-terminate when the gate voltage of the output device goes from the linear region to the saturation region. From this point the driver circuit will ramp the gate of the output device in a fashion necessary to generate the desired slew-rate of the output device. It may accomplish this by creating a current mirror, using the same type of devices as the output device so that it will track over process and temperature, and pulling down the gate of the output device with this current.

A top-level block diagram of an example of a voltage regulator (in this non-limiting example, a buck converter) is shown in FIG. 1. The voltage regulator (as an example of a DC-DC converter) comprises power FETs 20 (e.g., a top (high-side) power FET and a bottom (low-side) power FET), an inductance 32 coupled between an output node of the voltage regulator and the power FETs 20 (e.g., between the output node and an intermediate node between the top and bottom power FETs), and an RC circuit coupled to the output node. The RC circuit comprises a capacitance 34 and a resistance 36. The voltage converter further comprises a driver circuit block 10 that includes driver circuits for driving the power FETs 20 (e.g., for providing gate drive signals for the power FETs 20). The driver circuit block 10 receives control signals from a PWM block 60. For each power FET, the control signals may comprise or indicate an enable signal for switching on the respective power FET and an enable signal for switching off the respective power FET. The voltage regulator further comprises an error amplifier 54 for comparing an indication of the output voltage of the voltage regulator to a reference value 52 (e.g., supplied by a VDAC) and for controlling the PWM block 60. The input terminal of the error amplifier 54 to which the indication of the output voltage is provided may be coupled to the output of the error amplifier 54 via a first impedance 42. The output voltage of the voltage regulator may be provided to the error amplifier 54 via a second impedance 44. In this case, the voltage at the output of the second impedance 44 would serve as the indication of the output voltage. An output signal (VEA_out) of the error amplifier 54 is provided to the PWM block 60.

While the example of FIG. 1 illustrates a buck switching converter, the embodiments of the present disclosure are likewise applicable to a boost converter or a buck-boost converter. In fact, the embodiments of the present disclosure are applicable to DC-DC converters in general.

Figure 2:
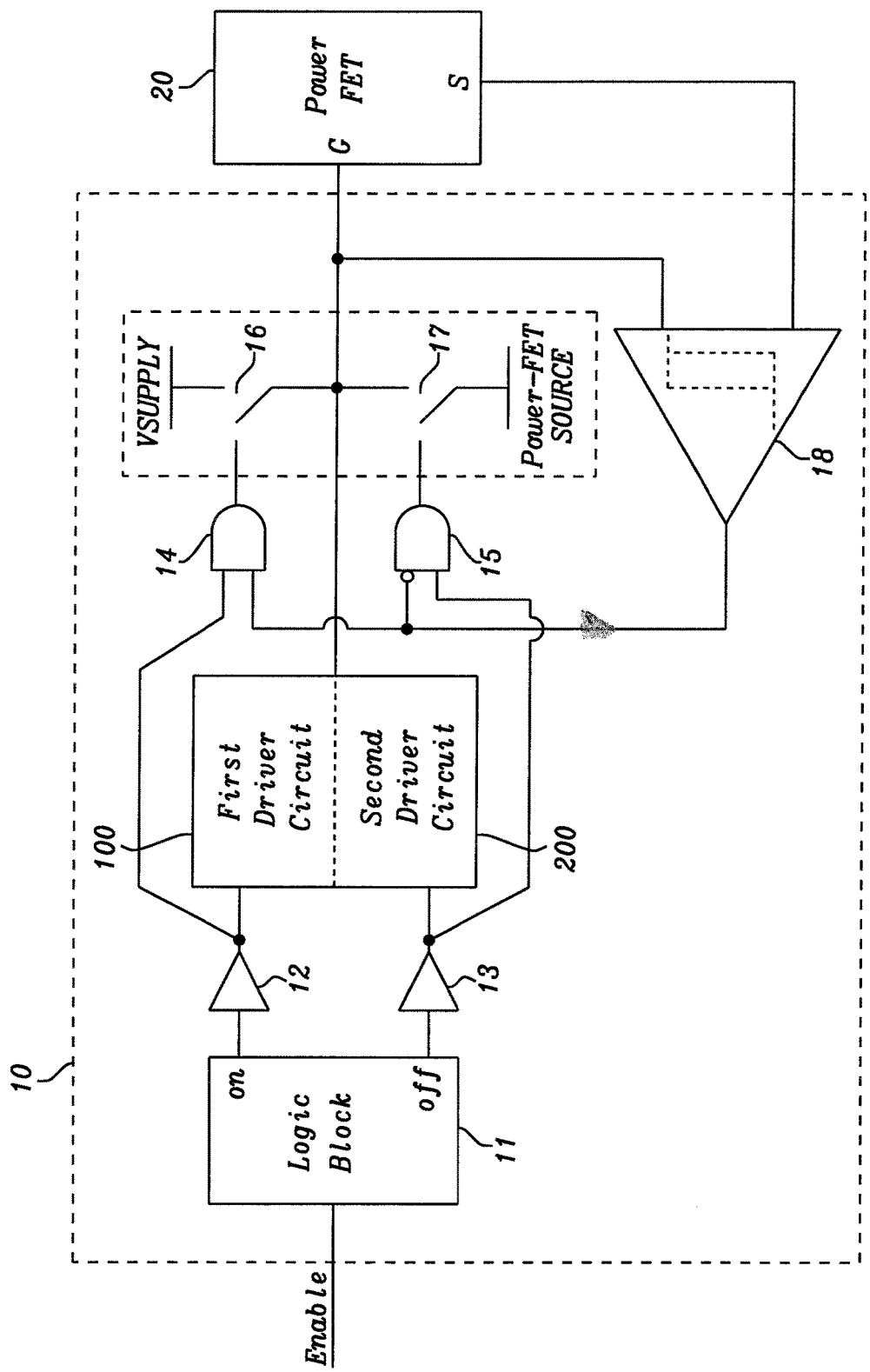

FIG. 2 shows an example of the driver circuit block 10. The driver circuit block 10 receives an enable signal (e.g., the control signal from the PWM block 60 or an enable signal based thereon). The enable signal is fed to non-overlap logic block 11 that generates respective enable signals for switching on and off the power FET 20 (which may be either of the top power FET and the bottom power FET; a corresponding structure may be provided for the respective other power FET). The enable signals are fed to respective fanout buffers 12, 13. The outputs of the fanout buffers 12, 13 are provided to a first driver circuit 100 (a driver circuit for ramp-up slew-on control) and a second driver circuit 200 (a driver circuit for ramp-down slew-off control). The enable signal for switching on the power FET 20 is provided to the first driver circuit 100 and the enable signal for switching off the power FET 20 is provided to the second driver circuit 200. Both driver circuits are coupled to a gate of the power FET 20 for driving the power FET 20. The first driver circuit 100 drives the power FET 20 when switching on the power FET 20 and the second driver circuit 200 drives the power FET 20 when switching off the power FET 20. The first and second driver circuits 100, 200 may be referred to as S-shaped gate drivers.

A gate-source voltage of the power FET 20 may be fed to a sense amplifier (e.g., comparator) 18 which compares the gate-source voltage of the power FET 20 to a reference, such as the threshold voltage of the power FET 20. In general, the sense amplifier 18 may be said to compare the gate drive signal of the power FET 20 to a reference value. The driver circuit block 10 further comprises a first logic AND gate 14 for receiving the comparison result from the sense amplifier 18 together with the enable signal for switching on the power FET 20, and a second logic AND gate 15 for receiving the inverted comparison result from the sense amplifier 18 together with the enable signal for switching off the power FET 20. The first logic AND gate 14 controls a first switch 16 to couple the gate of the power FET 20 to a supply voltage if the enable signal for switching on the power FET 20 is active and if the gates-source voltage of the power FET 20 is above the reference (e.g., the threshold voltage of the power FET 20). Thus, the first switch 16 couples the gate of the power FET 20 to the supply voltage level in dependence on a result of the comparison by the sense amplifier 18. The second logic AND gate 15 controls a second switch 17 to couple the gate of the power FET 20 to a source of the power FET 20 if the enable signal for switching off the power FET 20 is active and if the gates-source voltage of the power FET 20 is below the reference (e.g., the threshold voltage of the power FET 20). Thus, the second switch 17 couples the gate of the power FET 20 to the source of the power FET 20 in dependence on a result of the comparison by the sense amplifier 18.

In some implementations, one sense amplifier may be provided for each of the driver circuits. In general, the driver circuits may also be said to comprise the sense amplifier and any corresponding hard switches.

To summarize, the sense amplifier (senseamp comparator) 18 detects when the gate ramp-up is above the threshold voltage Vthr of the power FET, and likewise below the threshold voltage Vthr of the power FET. The sense amplifier 18 is used to determine when to engage/disengage the (hard)switches 16, 17. The (hard)switches 16, 17 reduce the load on the S-shaped gate drivers 100, 200, and are engaged after the S-shaped gate drivers 100, 200 have closed/opened the power FET 20. Hardswitches are not mandatory for S-shaped gate slewing, but do accelerate the third phase 713 and the sixth phase 716 illustrated in FIG. 7 and described below. Further, hardswitches allow the S-shaped gate drivers 100, 200 to be disabled between cycles, thereby reducing power consumption in the S-shaped gate drivers 100, 200.

As noted above, the sense amplifier 18, the logic AND gates 14, 15, and the switches 16, 17 may be optional.

Figure 7:
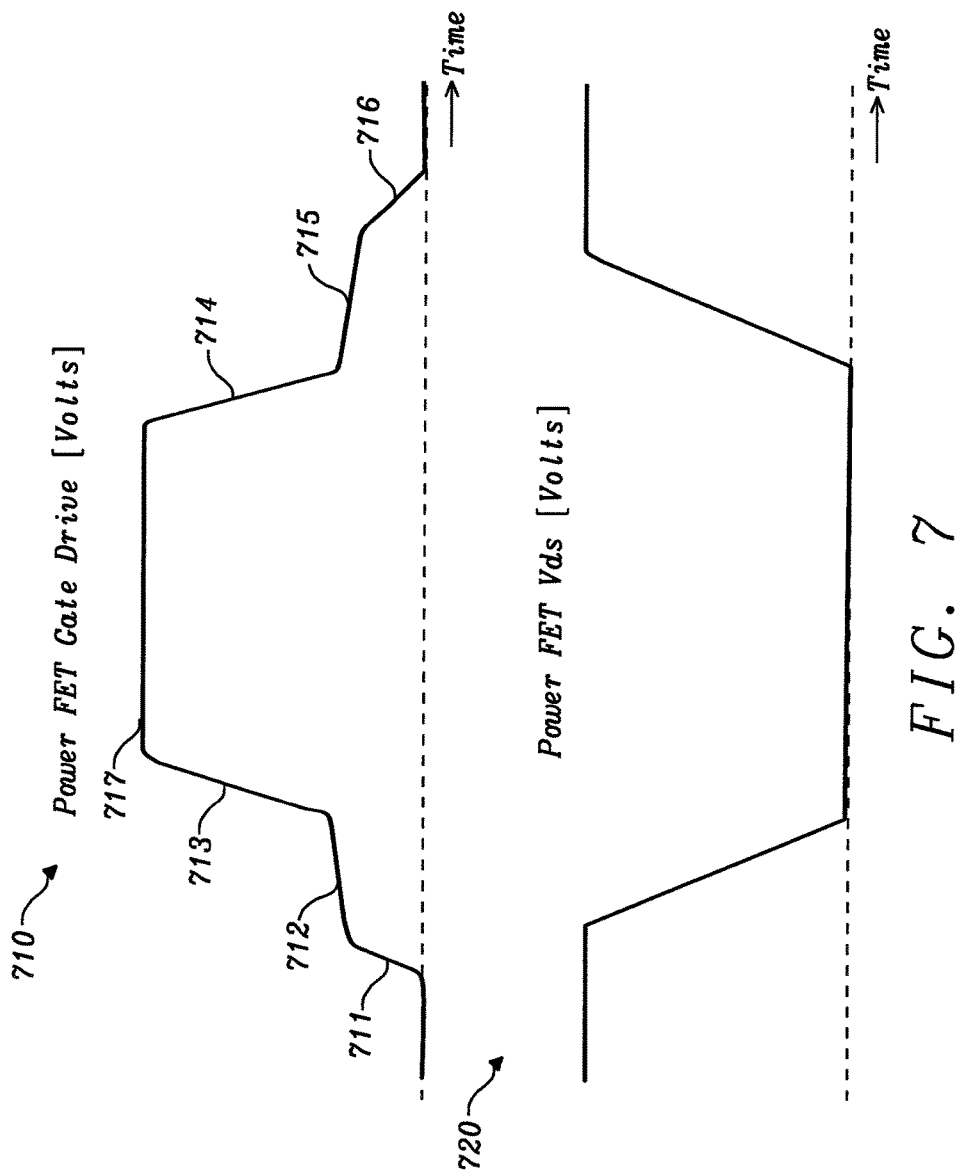

The first and second driver circuits 100, 200 are structured to implement an S-shaped gate voltage profile. An example of such profile is shown in FIG. 7. Curve 710 indicates the gate drive signal for the power FET (or the gate-source voltage Vgs) and curve 720 indicates the drain-source voltage Vds of the power FET. As can be seen from these curves, the driver circuits according to the present disclosure control the gate-source voltage Vgs of the power FET through discrete phases. The ramp-up of the gate-source voltage Vgs of the power FET, e.g., by the first driver circuit 100, includes first to third phases 711, 712, 713. The ramp-down of the gate-source voltage Vgs of the power FET, e.g., by the second driver circuit 200, includes fourth to sixth phases 714, 715, 716. Before ramp-up, the hard switch for pull-down (e.g., the second switch 17 in FIG. 2) is disengaged. The power FET rising edge is ramped as follows. In the first phase 711, subthreshold acceleration, the gate of the power FET is rapidly slewed through the power FET subthreshold region. In the second phase 712, saturation slew, the gate of the power FET is ramped through the saturation region under RC time-based control. In the third phase 713, triode slew and optional hard switch, a sense amplifier can be optionally used to detect saturation and engage a hard switch pull-up for triode switch closure. After undergoing the first three phases, the power FET gate-source voltage is maximum and the power FET is switched fully on. This is indicated by plateau 717.

The fourth to sixth phases are undergone when it is decided to switch off the power FET. Before ramp-down, the hard switch for pull-up (e.g., the first switch 16 in FIG. 2) is disengaged. The power FET falling edge is ramped as follows. In the fourth phase 714, diode-connected clamp down, a power FET gate-drain shunt is engaged to pull the gate of the power FET down through the triode region and into the saturation region, and to drive the power FET drain-source voltage Vds up to the threshold voltage Vthr. In the fifth phase 715, saturation gate ramp down, a ramped driver forces the gate-source voltage Vgs down through the saturation region. In the sixth phase 716, pull-down, a sense amplifier can be optionally used to detect whether the gate-source voltage Vgs is below the threshold voltage Vthr and engage a hard switch pull-down.

Figure 3:
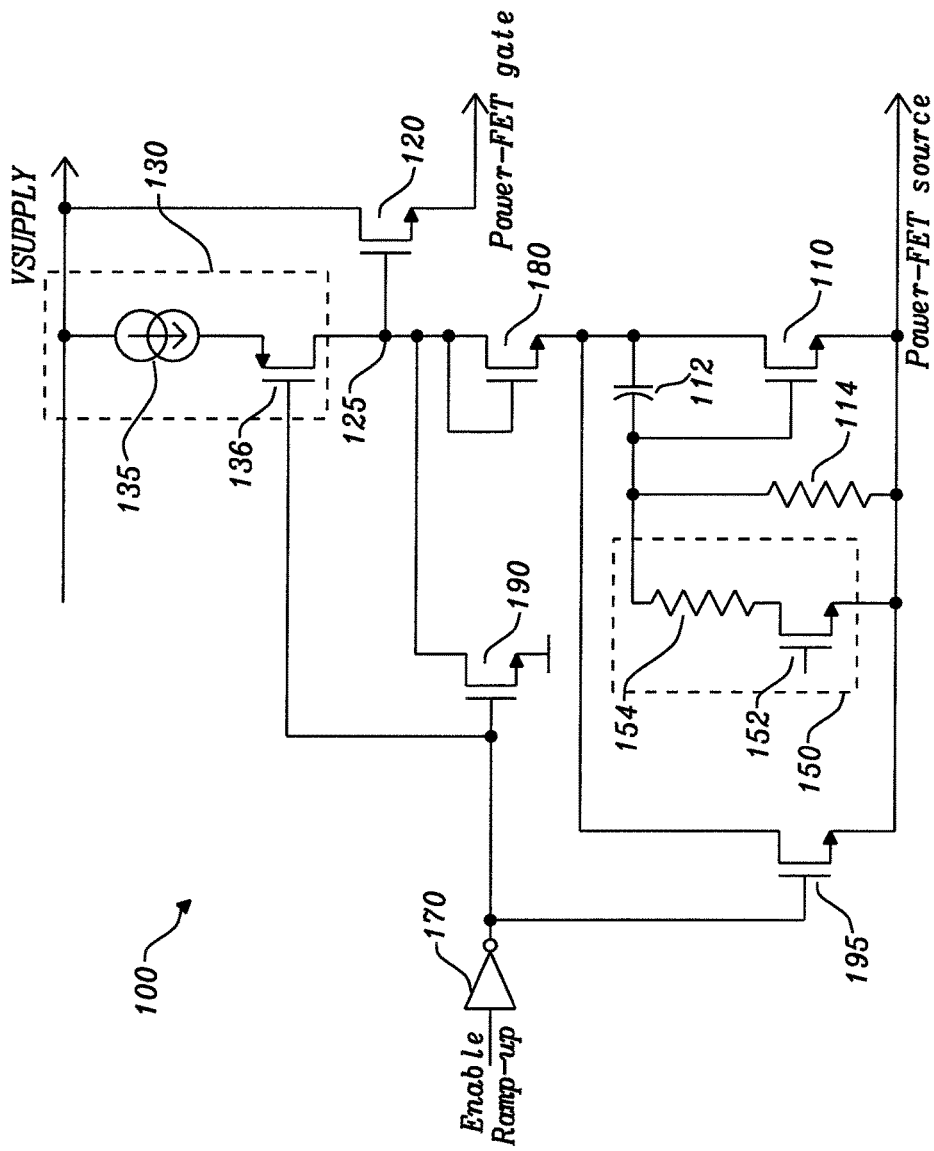

FIG. 3 schematically illustrates an example of a (first) driver circuit 100 (ramp-up driver) for driving a power FET in a DC-DC converter. In particular, the driver circuit 100 of FIG. 3 is a driver circuit for the rising edge of the gate voltage, i.e., for ramp-up of the gate voltage of the power FET. Accordingly, the driver circuit 100 may be referred to as a ramp-up slew-on driver circuit or a ramp-up slew-on control circuit.

The driver circuit 100 comprises a bias current generation circuit 130 for generating a bias current in response to an enable signal for switching on the power FET. The enable signal may be an enable signal for ramping up the gate voltage of the power FET. The bias current generation circuit 130 may be a switched current source, for example. I.e., it may include a current source 135 and a switch 136 that is switched in response to (e.g., in accordance with, or in dependence on) the enable signal. The switch 136 may be a transistor switch, for example.

The driver circuit 100 further comprises an output transistor 120 for outputting, at its source (source terminal), a gate drive signal for the power FET. That is, a gate (gate terminal) of the power FET may be coupled to the source of the output transistor 120. The output transistor 120 may be referred to as a source-follower buffer that provides the current to charge the gate of the power FET.

The driver circuit 100 further comprises a replica FET 110 of the power FET. The fact that this FET is a replica FET of the power FET will ensure self-termination of a rapid increase of the gate voltage of the power FET in the sub-threshold region (first phase 711 in FIG. 7). The replica FET 110 and the bias current generation circuit 130 are coupled in series between a supply voltage level (VSUP-PLY) and a source (source terminal) of the power FET.

A drain (drain terminal) of the output transistor 120 is coupled to the supply voltage level. A gate (gate terminal) of the output transistor 120 is coupled to an intermediate node 125 between the bias current generation circuit 130 and the replica FET 110. Thus, the bias current generation circuit 130 may be said to be coupled between the supply voltage level and the gate of the output transistor 120.

A gate (gate terminal) of the replica FET 110 is coupled (e.g., shorted) to a drain (drain terminal) of the replica FET 110 through a capacitor 112. Further, the gate of the replica FET 110 is coupled to the source of the power FET through a resistance 114 (e.g., a resistor). The capacitor 112 may be referred to as a Miller-tied capacitor across the replica FET 110. The capacitor 112 may be initialized (e.g., reset) as a diode connection across the replica FET 110, cycle-by-cycle. This may be achieved by means of a reset switch, as will be described below.

The driver circuit 100 may further comprise a transistor 180 coupled between the intermediate node 125 and the replica FET 110. A gate of the transistor 180 may be coupled to the drain of the transistor 180. This transistor 180 is a diode connected FET that, when biased, level shifts the gate of the output transistor 120 by its threshold voltage Vthr. If the transistor 180 is a replica of the output transistor 120, it can compensate for a voltage drop of the gate drive signal by the threshold voltage Vthr of the output transistor 120.

Once the enable signal is active, the bias current generation circuit 130 generates a bias current for the replica FET 110. Initially, the capacitor 112 serves as a short between the gate and the drain of the replica FET 110. Thus, as soon as the replica FET 110 is biased, a voltage across the replica FET 110 will be equal to the threshold voltage Vthr of the replica FET 110. Together with the transistor 180, the replica FET 110 thus applies a voltage that is twice the threshold voltage to the gate of the output transistor 120, to drive the output transistor 120. This accelerates the rise of the gate-source voltage Vgs of the power FET from 0V to the threshold voltage Vthr. Notably, this process is self-terminating.

The resistance 114 in combination with the capacitor 112 provide for gradual discharge of the gate of the replica FET 110. A time constant for this discharge is given by (a function of) the resistance value R and the capacitance value C. This discharge gradually terminates conduction of the replica FET 110, thus allowing the drain of the replica FET, and likewise, the gate of the output transistor 120, to gradually rise. This will gradually increase the gate drive signal, thereby driving the gate of the power FET from its threshold, through saturation (second phase 712 in FIG. 7). As the replica FET 110 slews to an "open" condition, the output transistor 120 drifts towards the supply voltage level VSUPPLY, thereby driving the gate of the power FET to within 1*Vgs of the supply voltage level VSUPPLY (third phase 713 in FIG. 7).

In some implementations, the driver circuit 100 may further comprise a series connection of a second resistance 154 and a transistor switch 152. This series connection may be coupled, in parallel to the (first) resistance 114, between the gate of the replica FET 110 and the source of the replica FET 110. By enabling the transistor switch 152, the time constant for gradually discharging the gate of the replica FET can be adjusted. In particular, enabling the transistor switch 152 allows the accelerated discharge of the gate of the replica FET 110, thereby accelerating the slewing of the gate of the power FET through saturation. The second resistance 154 and the transistor switch 152 may be said to form a circuit 150 for optional slew rate acceleration.

As described above with reference to FIG. 2, the gate of the power FET may be optionally coupled to the supply voltage level by a hard switch once the gate-source voltage Vgs of the power FET exceeds a certain threshold. However, this is not mandatory for driving the power FET through the triode region (third phase 713 in FIG. 7).

The driver circuit 100 may further comprise either or both of a first reset switch 190 for coupling the intermediate node 125 to ground in dependence on the enable signal, e.g., cycle-by-cycle, and a second reset switch 195 for coupling the drain of the replica FET 110 to the source of the power FET in dependence on the enable signal, e.g., cycle-by-cycle. This ensures consistent initial conditions (starting conditions) at the start of each ramp-up operation. The reset switches 190, 195 may be activated by an inverted version (enable_not) of the enable signal, for example.

The driver circuit 100 may also comprise an inverter 170 for inverting the enable signal as needed for appropriate switching operation of the (transistor) switches of the driver circuit 100.

Figure 4:
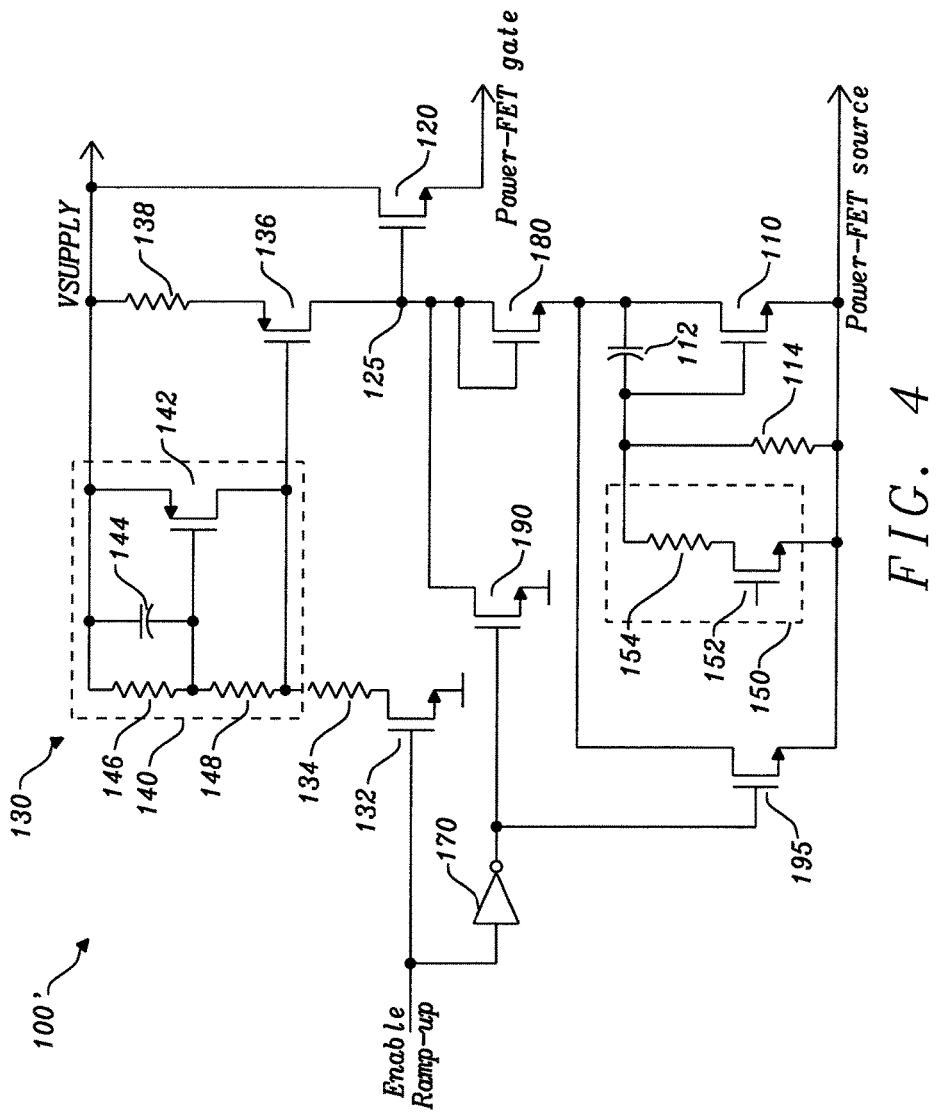

FIG. 4 schematically illustrates another example of a (first) driver circuit 100' (ramp-up driver) for driving a power FET in a DC-DC converter. In particular, the driver circuit 100' of FIG. 4 is a driver circuit for the rising edge of the gate voltage, i.e., for ramp-up of the gate voltage of the power FET. Accordingly, the driver circuit 100' may be referred to as a ramp-up slew-on driver circuit or a ramp-up slew-on control circuit.

The driver circuit 100' of FIG. 4 differs from the driver circuit 100 in FIG. 3 in the implementation of the bias current generation circuit 130. Otherwise, the driver circuits are the same and repeated description of identical elements may be omitted, for reasons of conciseness.

In the example of FIG. 4, the bias current generation circuit 130 comprises a switch 132 (e.g., transistor switch) that is switched in response to the enable signal. The bias current generation circuit 130 further comprises a gate-source voltage multiplier circuit 140 including a first transistor 142 and a resistor divider (voltage divider) that is coupled between a drain (drain terminal) and a source (source terminal) of the first transistor 142. An intermediate tap node of the resistor divider is coupled to a gate (gate terminal) of the first transistor 142. The bias current generation circuit further comprises a capacitor 144 coupled between the gate of the first transistor 142 and the source of the first transistor 142. Further, the bias current generation circuit 130 comprises a first resistance 134 for applying a bias to the gate-source voltage multiplier circuit 140. The gate-source voltage multiplier circuit 140, the first resistance 134, and the switch 132 are coupled in series between the supply voltage level and ground. Finally, the bias current generation circuit 130 comprises a second resistance 138 and a second transistor 136 that are coupled in series between the supply voltage level and the intermediate node 125.

In this configuration, the switch 132 and the first resistor 134 provide the bias current for the driver circuit 100'. The gate-source voltage multiplier circuit 140 biases the second resistance 138 with a bias current Ibias=(k*Vgs1−Vgs2)/R2, where k is a divider ratio of the resistor divider, R2 is the resistance value of the second resistance 138, Vgs1 is the gate-source voltage of the first transistor 142, and Vgs2 is the gate-source voltage of the second transistor 136. Broadly speaking, the gate-source voltage multiplier circuit 140 biases the second resistance 138 with a bias current that depends on a multiplied (e.g., scaled) gate-source voltage of the first transistor 142. The capacitor 144 causes a very rapid peaking of the current through the second resistance 138 and the second transistor 136 on the leading edge of the enable signal, e.g., within one nanosecond.

Figure 5A:
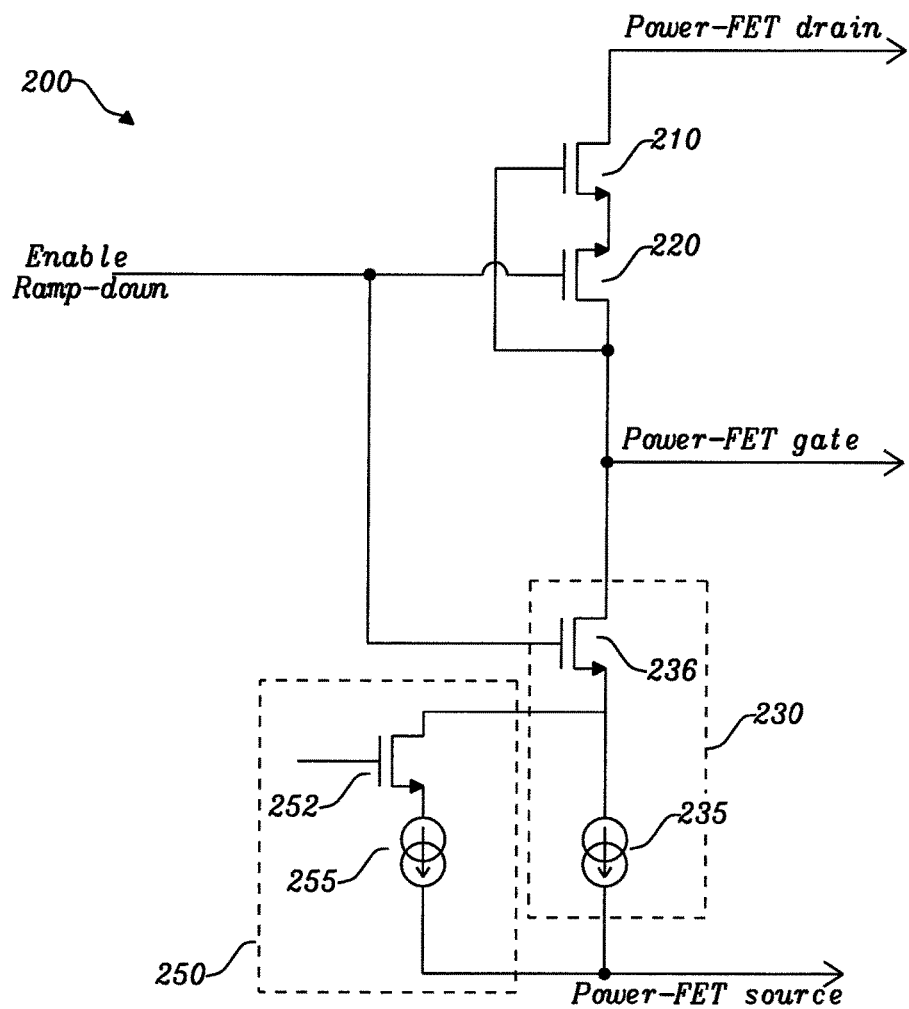

FIG. 5A schematically illustrates an example of a (second) driver circuit 200 (ramp-down driver) for driving a power FET in a DC-DC converter. In particular, the driver circuit 200 of FIG. 5A is a driver circuit for the falling edge of the gate voltage, i.e., for ramp-down of the gate voltage of the power FET. Accordingly, the driver circuit 200 may be referred to as a ramp-down slew-off driver circuit or a ramp-down slew-off control circuit.

The driver circuit 200 comprises a transistor switch 220 that is switched in response to (e.g., in accordance with, or in dependence on) an enable signal for switching off the power FET. The enable signal may be an enable signal for ramping down the gate voltage of the power FET. The driver circuit 200 further comprises a replica FET 210 of the power FET. The replica FET 210 and the transistor switch 220 are coupled in series between a drain (drain terminal) of the power FET and a gate (gate terminal) of the power FET. A source (source terminal) of the replica FET 210 is coupled to a source (source terminal) of the transistor switch 220. Further, a gate (gate terminal) of the replica FET 210 is coupled to the source of the replica FET 210 through the transistor switch 220. Thereby, the gate of the replica FET 210 is coupled to the gate of the power FET.

The start condition for ramping down the gate voltage of the power FET is the following. The gate voltage of the power FET is equal to the supply voltage. The source voltage of the power FET is equal to the drain voltage of the power FET. The source voltage and the drain voltage may be equal to the LX voltage of the power converter if the power FET is the high-side switch (top switch), or equal to ground if the power FET is the low-side switch (bottom switch). The transistor switch 222 is a switch that engages the replica FET 210 as a diode-connected FET that pulls the gate of the power FET from the supply voltage VSUPPLY down to a gate-source voltage Vgs that is equal to the threshold voltage Vthr. At the same time, the drain-source voltage Vds of the power FET is raised from 0 V (fourth phase 714 in FIG. 7). Since the replica FET 210 is a replica of the power FET, this process self-terminates with the replica FET 210 in a high impedance state once the gate-source voltage Vgs of the power FET reaches the threshold voltage Vthr. That is, the process self-terminates as soon as the drain-source voltage Vds of the power FET is greater than zero.

The driver circuit 200 further comprises a bias current generation circuit 230 for generating a bias current in response to the enable signal. The bias current generation circuit 230 may be a switched current source, for example. I.e., it may include a current source 235 and a switch 236 that is switched in response to (e.g., in accordance with, or in dependence on) the enable signal. The switch 236 may be a transistor switch, for example. The bias current generation circuit 230 is coupled between the gate of the power FET and a source (source terminal) of the power FET. The bias current generation circuit 230 serves to gradually lower the gate voltage of the power FET after the threshold voltage Vthr has been reached, thereby slewing the gate through saturation. The bias current generation circuit 230 may further serve to reduce the gate-source voltage Vgs of the power FET to zero in the sub-threshold region (sixth phase 716 in FIG. 7).

As described above with reference to FIG. 2, the gate of the power FET may be optionally coupled to the source of the power FET by a hard switch once the gate-source voltage Vgs of the power FET falls below a certain threshold. However, this is not mandatory for driving the power FET through the sub-threshold region (sixth phase 716 in FIG. 7).

Figure 5B:
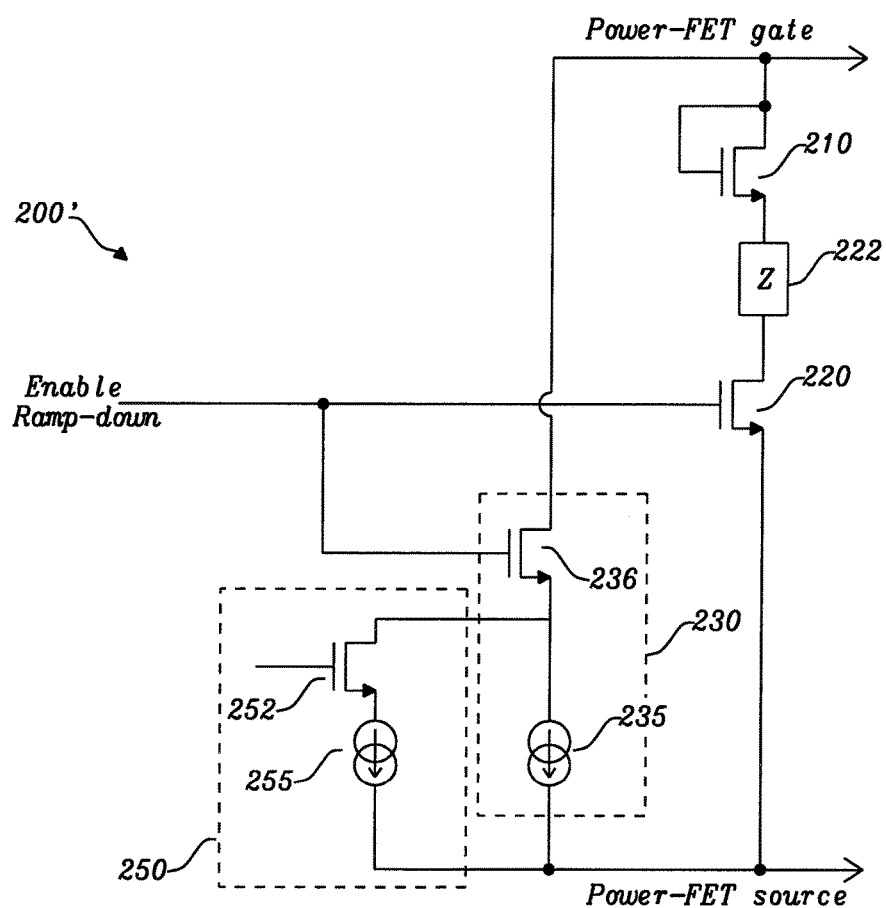

FIG. 5B schematically illustrates another example of a (second) driver circuit 200' (ramp-down driver) for driving a power FET in a DC-DC converter. In particular, the driver circuit 200' of FIG. 5B is a driver circuit for the falling edge of the gate voltage, i.e., for ramp-down of the gate voltage of the power FET. Accordingly, the driver circuit 200' may be referred to as a ramp-down slew-off driver circuit or a ramp-down slew-off control circuit.

The driver circuit 200' of FIG. 5B differs from the driver circuit 200 of FIG. 5A in that the driver circuit 200' comprises an additional voltage stretch element 222 (e.g., an impedance) and features an alternative coupling of the replica FET 210 and the transistor switch 220. Otherwise, the driver circuits are the same and repeated description of identical elements may be omitted, for reasons of conciseness.

In the driver circuit 200' of FIG. 5B, the replica FET 210, the voltage stretch element 222, and the transistor switch 220 are coupled in series between a gate of the power FET and a source of the power FET. In particular, the voltage stretch element 222 is coupled between the source of the replica FET 210 and the drain of the transistor switch 220.

Further, the gate of the replica FET 210 is coupled to the drain of the replica FET 210. Thereby, the gate of the replica FET 210 is coupled to the gate of the power FET.

Figure 6:
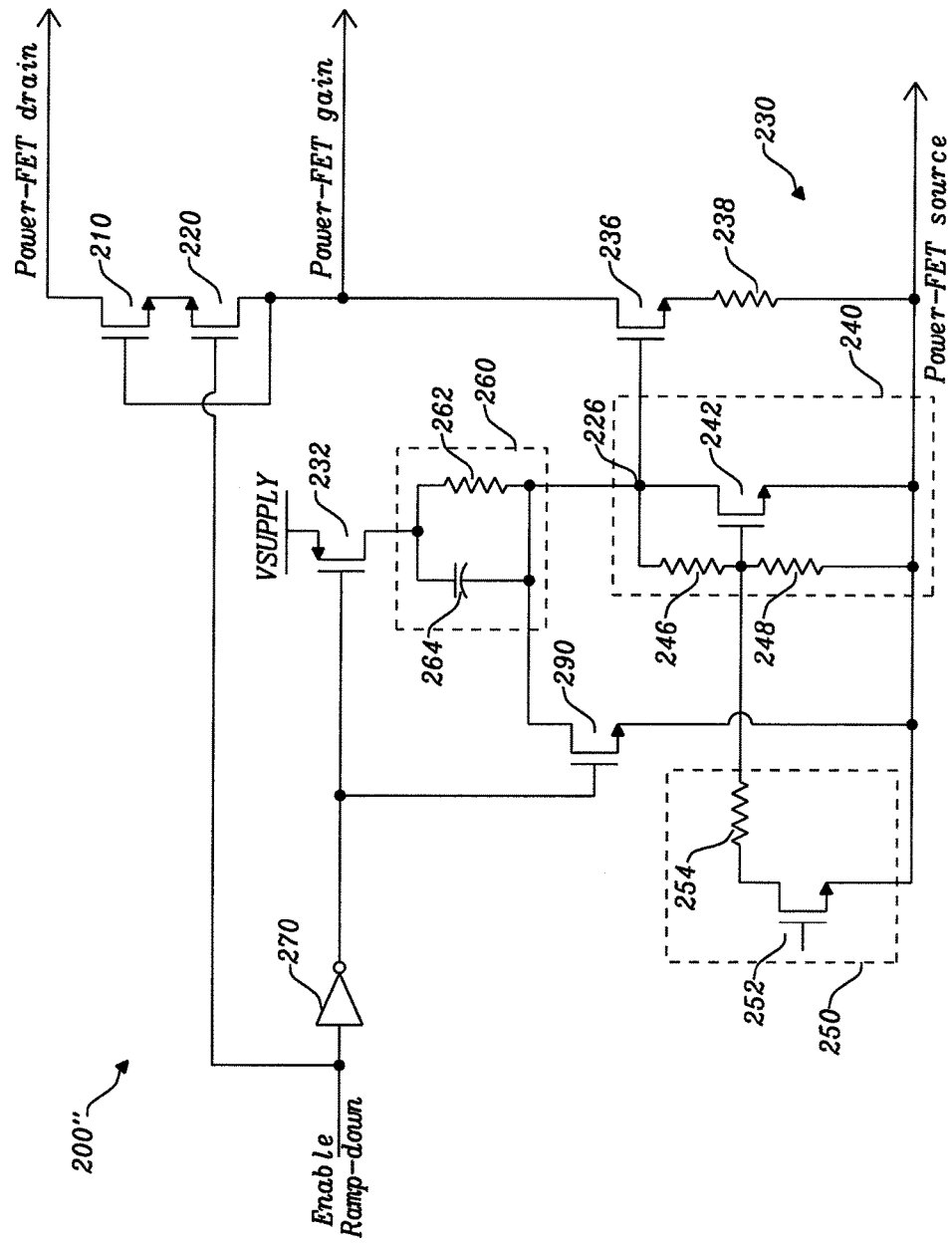

FIG. 6 schematically illustrates another example of a (second) driver circuit 200'' (ramp-down driver) for driving a power FET in a DC-DC converter. In particular, the driver circuit 200'' of FIG. 6 is a driver circuit for the falling edge of the gate voltage, i.e., for ramp-down of the gate voltage of the power FET. Accordingly, the driver circuit 200'' may be referred to as a ramp-down slew-off driver circuit or a ramp-down slew-off control circuit.

The driver circuit 200'' of FIG. 6 differs from the driver circuit 200 in FIG. 5A in the implementation of the bias current generation circuit 230. Otherwise, the driver circuits are the same and repeated description of identical elements may be omitted, for reasons of conciseness.

The bias current generation circuit 230 of the driver circuit 200'' comprises a switch 232 (e.g., transistor switch) that is switched in response to the enable signal. The bias current generation circuit 230 further comprises an RC circuit 260 that includes a parallel connection of a first resistance 262 and a capacitor 264. The bias current generation circuit 230 further comprises a gate-source voltage multiplier circuit 240. The gate-source voltage multiplier circuit 240 includes a first transistor 242 and a resistor divider (voltage divider) that is coupled between a drain (drain terminal) and a source (source terminal) of the first transistor 242. An intermediate tap node of the resistor divider is coupled to a gate (gate terminal) of the first transistor 242. The bias current generation circuit 230 further comprises a second transistor 236 and a second resistance 238 that are coupled in series between the gate of the power FET and the source of the power FET. The switch 232, the RC circuit 260, and the gate-source voltage multiplier circuit 240 are coupled in series between the supply voltage level and the source of the power FET. A gate (gate terminal) of the second transistor 236 is coupled to an intermediate node 226 between the RC circuit 260 and the gate-source voltage multiplier circuit 240, so that a voltage that depends on a multiplied (e.g., scaled) gate-source voltage of the first transistor 242 is provided to the gate of the second transistor 236.

In this configuration, the switch 232 provides the bias current for the ramp-down driver through the first resistance 262. The resistances of the resistor divider and the first transistor 242 form a gate-source voltage multiplier circuit (i.e., a (NMOS) threshold voltage multiplier) that biases the second resistance 238 with a bias current Ibias=(k*Vgs1−Vgs2)/R2, where k is a divider ratio of the resistor divider, R2 is the resistance value of the second resistance 238, Vgs1 is the gate-source voltage of the first transistor 242, and Vgs2 is the gate-source voltage of the second transistor 236. Broadly speaking, the gate-source voltage multiplier circuit 240 biases the second resistance 238 with a bias current that depends on a multiplied (e.g., scaled) gate-source voltage of the first transistor 242. The capacitor 264 causes a very rapid peaking of the current through the second resistance 238 and the second transistor 236 on the leading edge of the enable signal, e.g., within one nanosecond.

The second resistor 238 and the second transistor 236 form a discharge circuit for discharging the gate of the power FET in the fifth phase 715 in FIG. 7. This discharge circuit is also capable of ramping the gate of the power FET through the sixth phase 716 in FIG. 7, although a hard switching operation can accelerate the ramping down of the gate voltage of the power FET in the sixth phase 716.

In some implementations, the driver circuit 200" may further comprise a series connection of a third resistance 254 and a third transistor switch 252. This series connection may be coupled between a gate of the first transistor 242 and the source of the power FET. By enabling the third transistor switch 252, a multiplication ratio of the gate-source voltage multiplier circuit 240 can be modified. Thereby, the third resistance 254 and the third transistor switch 252 can adjust the discharge current from the gate of the power FET. This allows to modify (e.g., increase) the slew rate of the gate of the power FET through saturation. The third resistance 254 and the third transistor switch 252 may be said to form a circuit 250 for optional slew rate acceleration.

The driver circuit 200" may further comprise a reset switch 290 for coupling the intermediate node 226 to ground in dependence on the enable signal, e.g., cycle-by-cycle. For example, the reset switch 290 may be activated by an inverted version (enable_not) of the enable signal. This ensures consistent initial conditions (starting conditions) at the start of each ramp-down operation.

Figure 8:
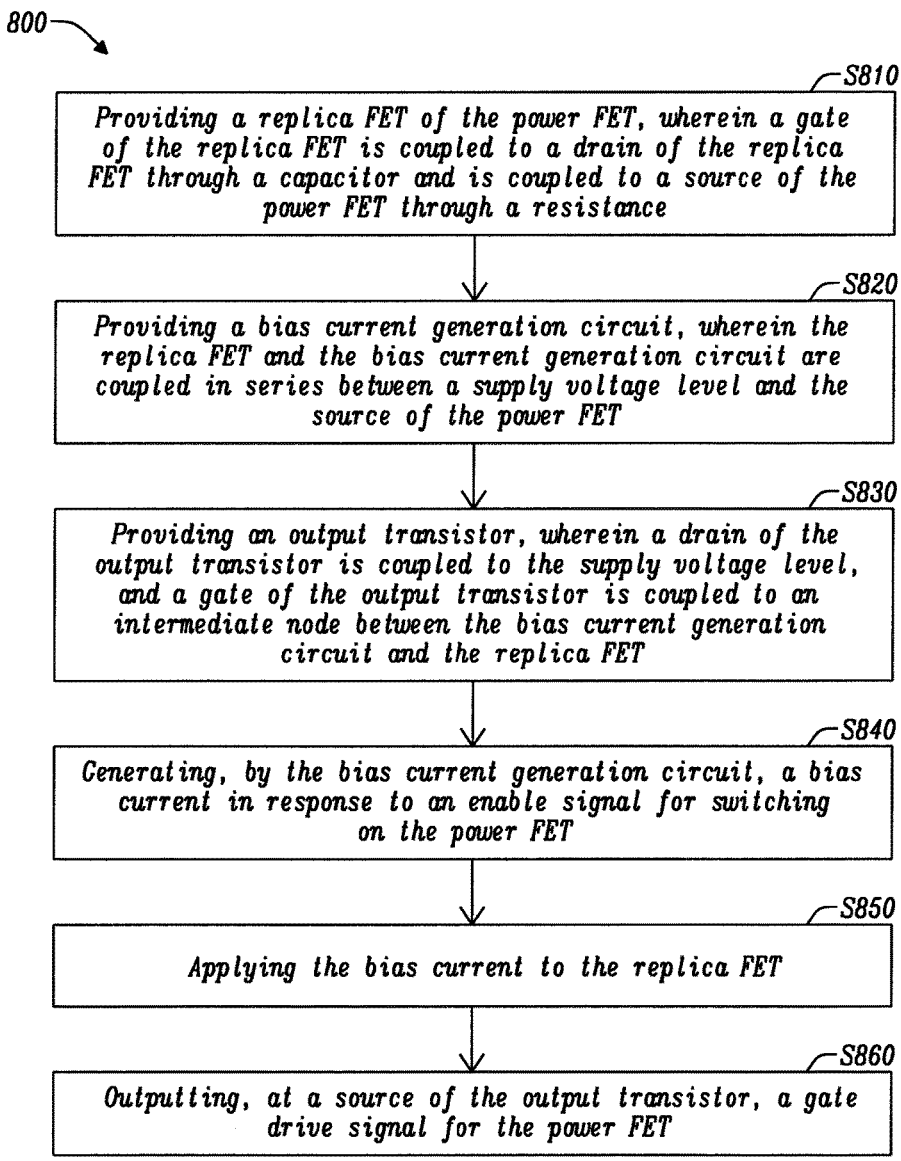
FIG. 8, FIG. 9, and FIG. 10 are flowcharts schematically illustrating methods of driving power FETs according to embodiments of the disclosure.

FIG. 8 is a flowchart schematically illustrating a method 800 for driving (ramping up) a power FET of a DC-DC converter, e.g., by the driver circuit 100 of FIG. 3.

At step S810, a replica FET of the power FET is provided. A gate of the replica FET is coupled to a drain of the replica FET through a capacitor. The gate of the replica FET is further coupled to a source of the power FET through a resistance.

At step S820, a bias current generation circuit is provided. The replica FET and the bias current generation circuit are coupled in series between a supply voltage level and the source of the power FET.

At step S830, an output transistor is provided. A drain of the output transistor is coupled to the supply voltage level. Further, a gate of the output transistor is coupled to an intermediate node between the bias current generation circuit and the replica FET.

At step S840, a bias current is generated, by the bias current generation circuit, in response to an enable signal for switching on the power FET.

At step S850, the bias current is applied to the replica FET.

At step S860, a gate drive signal for the power FET is output at a source of the output transistor.

Figure 9:
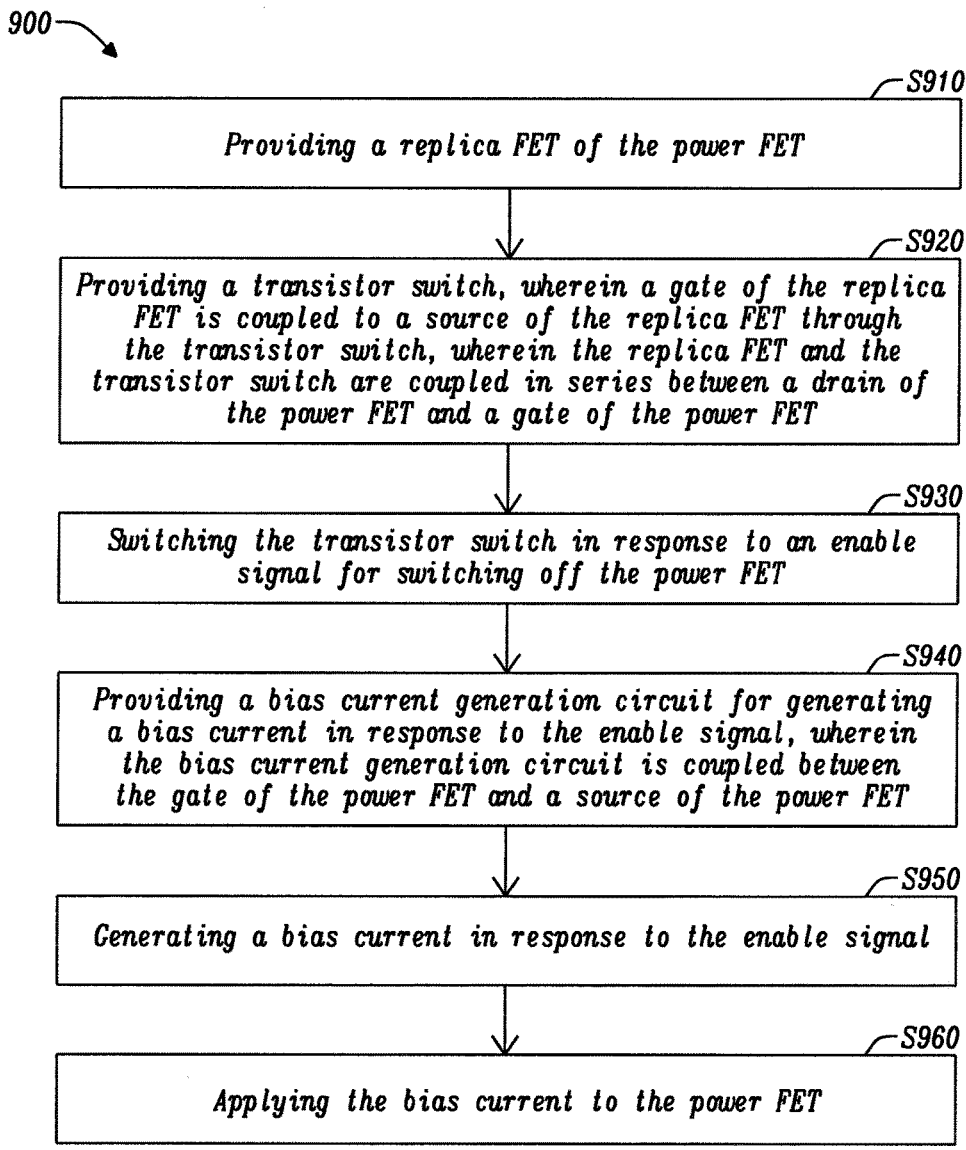

FIG. 9 is a flowchart schematically illustrating a method 900 for driving (ramping down) a power FET of a DC-DC converter, e.g., by the driver circuit 200 of FIG. 5A.

At step S910, a replica FET of the power FET is provided.

At step S920, a transistor switch is provided. A gate of the replica FET is coupled to a source of the replica FET through the transistor switch. The replica FET and the transistor switch are coupled in series between a drain of the power FET and a gate of the power FET.

At step S930, the transistor switch is switched in response to an enable signal for switching off the power FET.

At step S940, a bias current generation circuit is provided for generating a bias current in response to the enable signal. The bias current generation circuit is coupled between the gate of the power FET and a source of the power FET.

At step S950, a bias current is generated, by the bias current generation circuit, in response to the enable signal.

At step S960, the bias current is applied to the power FET.

In the above, steps S940, S950, and S960 may be optional.

Figure 10:
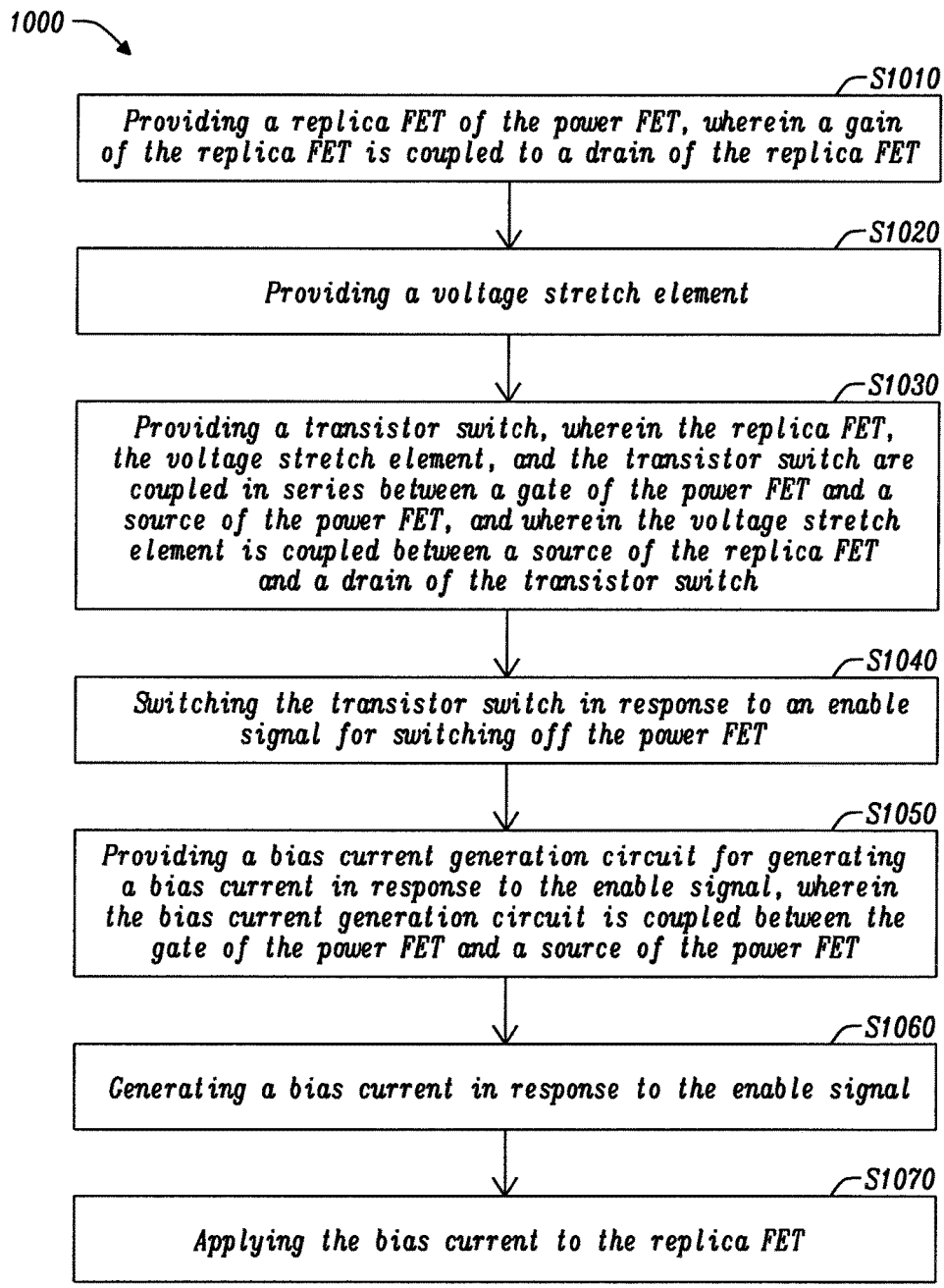

FIG. 10 is a flowchart schematically illustrating a method 1000 for driving (ramping down) a power FET of a DC-DC converter, e.g., by the driver circuit 200' of FIG. 5B.

At step S1010, a replica FET of the power FET is provided. A gate of the replica FET is coupled to a drain of the replica FET.

At step S1020, a voltage stretch element (e.g., impedance) is provided.

At step S1030, a transistor switch is provided. The replica FET, the voltage stretch element, and the transistor switch are coupled in series between a gate of the power FET and a source of the power FET. Further, the voltage stretch element is coupled between a source of the replica FET and a drain of the transistor switch.

At step S1040, the transistor switch is switched in response to an enable signal for switching off the power FET.

At step S1050, a bias current generation circuit is provided for generating a bias current in response to the enable signal. The bias current generation circuit is coupled between the gate of the power FET and a source of the power FET.

At step S1060, a bias current is generated, by the bias current generation circuit, in response to the enable signal; and At step S1070, the bias current is applied to the replica FET.

In the above, steps S1050, S1060, and S1070 may be optional.

The present disclosure further relates to DC-DC converters comprising any of the driver circuits described above.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing and/or arranging respective elements of these circuits.

While the driver circuits and methods described in the disclosure are applied to a regulator with NMOS top switch and NMOS bottom switch, they are equally applicable to a regulator with a PMOS top switch, e.g., by appropriate mirroring.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A driver circuit for driving a power field effect transistor, FET, in a DC-DC converter, the driver circuit comprising:
   a bias current generation circuit for generating a bias current in response to an enable signal for switching on the power FET;
   an output transistor for outputting, at its source, a gate drive signal for the power FET;

a replica FET of the power FET,
wherein the replica FET and the bias current generation circuit are coupled in series between a supply voltage level and a source of the power FET;
wherein a drain of the output transistor is coupled to the supply voltage level, and a gate of the output transistor is coupled to an intermediate node between the bias current generation circuit and the replica FET; and
wherein a gate of the replica FET is coupled to a drain of the replica FET through a capacitor and is coupled to the source of the power FET through a resistance.

2. The driver circuit according to claim 1, further comprising:
a comparator for comparing the gate drive signal for the power FET to a reference value; and
a switch for coupling a gate of the power FET to the supply voltage level in dependence on a result of the comparison.

3. The driver circuit according to claim 1,
wherein the resistance is a first resistance; and
the driver circuit further comprises a series connection of a second resistance and a transistor switch, the series connection being coupled, in parallel to the first resistance, between the gate of the replica FET and the source of the replica FET.

4. The driver circuit according to claim 1, further comprising a transistor coupled between the intermediate node and the replica FET,
wherein a gate of the transistor is coupled to a drain of the transistor.

5. The driver circuit according to claim 1, wherein the bias current generation circuit comprises:
a switch that is switched in response to the enable signal;
a gate-source voltage multiplier circuit including a first transistor and a resistor divider that is coupled between a drain and a source of the first transistor, wherein an intermediate tap node of the resistor divider is coupled to a gate of the first transistor;
a capacitor coupled between the gate of the first transistor and the source of the first transistor;
a first resistance for applying a bias to the gate-source voltage multiplier circuit; and
a second resistance and a second transistor that are coupled in series between the supply voltage level and the intermediate node,
wherein the gate-source voltage multiplier circuit, the first resistance, and the switch are coupled in series between the supply voltage level and ground; and
wherein the gate-source voltage multiplier circuit biases the second resistance with the bias current, wherein the bias current depends on a multiplied gate-source voltage of the first transistor.

6. The driver circuit according to claim 1, further comprising:
a first reset switch for coupling the intermediate node to ground in dependence on the enable signal; and/or
a second reset switch for coupling the drain of the replica FET to the source of the power FET in dependence on the enable signal.

7. A driver circuit for driving a power field effect transistor, FET, in a DC-DC converter, the driver circuit comprising:
a transistor switch that is switched in response to an enable signal for switching off the power FET; and a replica FET of the power FET,
wherein the replica FET and the transistor switch are coupled in series between a drain of the power FET and a gate of the power FET; and
wherein a gate of the replica FET is coupled to a source of the replica FET through the transistor switch.

8. The driver circuit according to claim 7, further comprising:
a bias current generation circuit for generating a bias current in response to the enable signal,
wherein the bias current generation circuit is coupled between the gate of the power FET and a source of the power FET.

9. The driver circuit according to claim 8, wherein the bias current generation circuit comprises:
a switch that is switched in response to the enable signal;
an RC circuit including a parallel connection of a first resistance and a capacitor;
a gate-source voltage multiplier circuit including a first transistor and a resistor divider that is coupled between a drain and a source of the first transistor, wherein an intermediate tap node of the resistor divider is coupled to a gate of the first transistor; and
a second transistor and a second resistance that are coupled in series between the gate of the power FET and the source of the power FET,
wherein the switch, the RC circuit, and the gate-source voltage multiplier circuit are coupled in series between the supply voltage level and the source of the power FET; and
wherein a gate of the second transistor is coupled to an intermediate node between the RC circuit and the gate-source voltage multiplier circuit, so that a voltage that depends on a multiplied gate-source voltage of the first transistor is provided to the gate of the second transistor.

10. The driver circuit according to claim 9, further comprising:
a series connection of a third resistance and a transistor switch, the series connection being coupled between a gate of the first transistor and the source of the power FET, so that a multiplication ratio of the gate-source voltage multiplier circuit is modified when the transistor switch is switched on.

11. The driver circuit according to claim 9, further comprising:
a reset switch for coupling the intermediate node to the source of the power FET in dependence on the enable signal.

12. The driver circuit according to claim 7, further comprising:
a comparator for comparing the gate drive signal for the power FET to a reference value; and
a switch for coupling the gate of the power FET to the source of the power FET in dependence on a result of the comparison.

13. A driver circuit for driving a power field effect transistor, FET, in a DC-DC converter, the driver circuit comprising:
a transistor switch that is switched in response to an enable signal for switching off the power FET;
a replica FET of the power FET; and
a voltage stretch element,
wherein the replica FET, the voltage stretch element, and the transistor switch are coupled in series between a gate of the power FET and a source of the power FET;

wherein the voltage stretch element is coupled between a source of the replica FET and a drain of the transistor switch; and wherein a gate of the replica FET is coupled to a drain of the replica FET.

14. A method of driving a power field effect transistor, FET, in a DC-DC converter, the method comprising the steps of:

providing a replica FET of the power FET, wherein a gate of the replica FET is coupled to a drain of the replica FET through a capacitor and is coupled to a source of the power FET through a resistance;

providing a bias current generation circuit, wherein the replica FET and the bias current generation circuit are coupled in series between a supply voltage level and the source of the power FET;

providing an output transistor, wherein a drain of the output transistor is coupled to the supply voltage level, and a gate of the output transistor is coupled to an intermediate node between the bias current generation circuit and the replica FET;

generating, by the bias current generation circuit, a bias current in response to an enable signal for switching on the power FET;

applying the bias current to the replica FET; and outputting, at a source of the output transistor, a gate drive signal for the power FET.

15. The method according to claim 14, further comprising the steps of:

comparing the gate drive signal for the power FET to a reference value; and coupling, by a switch, a gate of the power FET to the supply voltage level in dependence on a result of the comparison.

16. The method according to claim 14, wherein the resistance is a first resistance; and wherein the method further comprises the steps of:

providing a series connection of a second resistance and a transistor switch that is coupled, in parallel to the first resistance, between the gate of the replica FET and the source of the replica FET; and operating the switch to increase a voltage slew rate at a gate of the power FET.

17. The method according to claim 14, further comprising providing a transistor coupled between the intermediate node and the replica FET, wherein a gate of the transistor is coupled to a drain of the transistor.

18. The method according to claim 14, wherein the bias current generation circuit comprises:

a switch that is switched in response to the enable signal;

a gate-source voltage multiplier circuit including a first transistor and a resistor divider that is coupled between a drain and a source of the first transistor, wherein an intermediate tap node of the resistor divider is coupled to a gate of the first transistor;

a capacitor coupled between the gate of the first transistor and the source of the first transistor;

a first resistance for applying a bias to the gate-source voltage multiplier circuit; and a second resistance and a second transistor that are coupled in series between the supply voltage level and the intermediate node, wherein the gate-source voltage multiplier circuit, the first resistance, and the switch are coupled in series between the supply voltage level and ground; and wherein the gate-source voltage multiplier circuit biases the second resistance with the bias current, wherein the bias current depends on a multiplied gate-source voltage of the first transistor.

19. The method according to claim 14, further comprising the steps of:

coupling, by a first reset switch, the intermediate node to ground in dependence on the enable signal; and/or coupling, by a second reset switch, the drain of the replica FET to the source of the power FET in dependence on the enable signal.

20. The method of driving the power FET of claim 14, wherein said method of driving is utilized in operating the DC-DC converter, comprising: ramping-up a gate voltage of the power FET.

21. A method of driving a power field effect transistor, FET, in a DC-DC converter, the method comprising the steps of:

providing a replica FET of the power FET;

providing a transistor switch, wherein a gate of the replica FET is coupled to a source of the replica FET through the transistor switch, wherein the replica FET and the transistor switch are coupled in series between a drain of the power FET and a gate of the power FET; and switching the transistor switch in response to an enable signal for switching off the power FET.

22. The method according to claim 21, further comprising the steps of:

providing a bias current generation circuit for generating a bias current in response to the enable signal, wherein the bias current generation circuit is coupled between the gate of the power FET and a source of the power FET;

generating a bias current in response to the enable signal; and applying the bias current to the power FET.

23. The method according to claim 22, wherein the bias current generation circuit comprises:

a switch that is switched in response to the enable signal;

an RC circuit including a parallel connection of a first resistance and a capacitor;

a gate-source voltage multiplier circuit including a first transistor and a resistor divider that is coupled between a drain and a source of the first transistor, wherein an intermediate tap node of the resistor divider is coupled to a gate of the first transistor; and a second transistor and a second resistance that are coupled in series between the gate of the power FET and the source of the power FET, wherein the switch, the RC circuit, and the gate-source voltage multiplier circuit are coupled in series between the supply voltage level and the source of the power FET; and wherein a gate of the second transistor is coupled to an intermediate node between the RC circuit and the gate-source voltage multiplier circuit, so that a voltage that depends on a multiplied gate-source voltage of the first transistor is provided to the gate of the second transistor.

24. The method according to claim 23, further comprising the steps of:

providing a series connection of a third resistance and a transistor switch that is coupled between a gate of the first transistor and the source of the power FET;

operating the transistor switch to modify a multiplication ratio of the gate-source voltage multiplier circuit.

25. The method according to claim 23, further comprising the step of:
  coupling, by a reset switch, the intermediate node to the source of the power FET in dependence on the enable signal.

26. The method according to claim 21, further comprising the steps of:
  comparing the gate drive signal for the power FET to a reference value; and
  coupling, by a switch, the gate of the power FET to the source of the power FET in dependence on a result of the comparison.

27. The method of driving the power FET of claim 21, wherein said method of driving is utilized in operating the DC-DC converter, comprising:
  ramping-down a gate voltage of the power FET.

28. A method of driving a power field effect transistor, FET, in a DC-DC converter, the method comprising the steps of:
  providing a replica FET of the power FET, wherein a gate of the replica FET is coupled to a drain of the replica FET;
  providing a voltage stretch element;
  providing a transistor switch, wherein the replica FET, the voltage stretch element, and the transistor switch are coupled in series between a gate of the power FET and a source of the power FET, and wherein the voltage stretch element is coupled between a source of the replica FET and a drain of the transistor switch; and
  switching the transistor switch in response to an enable signal for switching off the power FET.

* * * * *